(12) United States Patent
Hase

(10) Patent No.: US 11,198,369 B2
(45) Date of Patent: Dec. 14, 2021

(54) POWER SUPPLY APPARATUS

(71) Applicant: DENSO CORPORATION, Kariya (JP)

(72) Inventor: Tomomi Hase, Kariya (JP)

(73) Assignee: DENSO CORPORATION, Kariya (JP)

( * ) Notice: Subject to any disclaimer, the term of this patent is extended or adjusted under 35 U.S.C. 154(b) by 165 days.

(21) Appl. No.: 16/247,923

(22) Filed: Jan. 15, 2019

(65) Prior Publication Data
US 2019/0225097 A1 Jul. 25, 2019

(30) Foreign Application Priority Data
Jan. 19, 2018 (JP) .............................. JP2018-007546

(51) Int. Cl.
*B60L 53/12* (2019.01)
*B60L 53/30* (2019.01)
*B60L 58/13* (2019.01)
*B60R 21/015* (2006.01)
*B60L 53/60* (2019.01)
*H02J 7/02* (2016.01)
*G01R 19/165* (2006.01)

(52) U.S. Cl.
CPC ............. *B60L 53/12* (2019.02); *B60L 53/305* (2019.02); *B60L 53/60* (2019.02); *B60L 58/13* (2019.02); *B60R 21/0152* (2014.10); *B60R 21/01538* (2014.10); *G01R 19/16542* (2013.01); *H02J 7/025* (2013.01)

(58) Field of Classification Search
CPC ........ B60L 53/12; B60L 53/305; B60L 58/13; B60L 53/60; B60L 53/124; B60L 53/62; B60L 53/66; B60R 21/0152; B60R 21/01538; H02J 7/025; G01R 19/16542; Y02T 90/12; Y02T 10/7072; Y02T 90/14; Y02T 10/70; Y02T 90/16
USPC ........................................................ 320/108
See application file for complete search history.

(56) References Cited

U.S. PATENT DOCUMENTS 10,773,596 B2 * 9/2020 Martin .................... B60L 53/12
2012/0200151 A1 * 8/2012 Obayashi .............. B60L 53/124
307/9.1

(Continued)

FOREIGN PATENT DOCUMENTS

| JP | 2012-165497 A | 8/2012 |
|----|---------------|--------|
| JP | 2013-051744 A | 3/2013 |
| JP | 2013-132170 A | 7/2013 |

*Primary Examiner* — Richard V Muralidar
(74) *Attorney, Agent, or Firm* — Oliff PLC

(57) ABSTRACT

A power supply apparatus acquires peripheral information regarding whether a living body is present outside a vehicle near a power supplying unit, during power supply to the vehicle. The power supply apparatus acquires in-vehicle information regarding whether a living body is present inside the vehicle, during power supply to the vehicle. The power supply apparatus restricts supplied electric power when in-vehicle information indicating that a living body is present inside the vehicle is acquired or when peripheral information indicating that a living body is present near the power supplying unit is acquired. The power supply apparatus changes a restriction amount of the supplied electric power when at least either of in-vehicle information indicating that a living body is present inside the vehicle or peripheral information indicating that a living body is present near the power supplying unit is acquired, compared to that when neither piece of information is acquired.

17 Claims, 11 Drawing Sheets

(56) References Cited

U.S. PATENT DOCUMENTS

2014/0092243 A1  4/2014  Ichikawa
2016/0039302 A1* 2/2016  Schwab .............. B60L 11/1838
                                                    320/108

* cited by examiner

POWER SUPPLY APPARATUS

CROSS-REFERENCE TO RELATED APPLICATION

This application is based on and claims the benefit of priority from Japanese Patent Application No. 2018-007546, filed Jan. 19, 2018. The entire disclosure of the above application is incorporated herein by reference.

BACKGROUND

Technical Field

The present disclosure relates to a power supply apparatus that supplies electric power in a contactless manner.

Related Art

A contactless power supply system has been proposed. In the contactless power supply system, electric power is supplied to a vehicle, such as an electric car, in a contactless manner through electromagnetic induction. Thus, a storage battery provided in the vehicle is charged.

SUMMARY

An exemplary embodiment provides a power supply apparatus that supplies electric power in a contactless manner to a power receiving unit provided in a vehicle that moves using electric power stored in a storage battery provided in the vehicle. The power supply apparatus restricts supplied electric power when in-vehicle information indicating that a living body is present inside the vehicle is acquired or when peripheral information indicating that a living body is present near the power supplying unit is is acquired.

DESCRIPTION OF THE EMBODIMENTS

Figure 1:
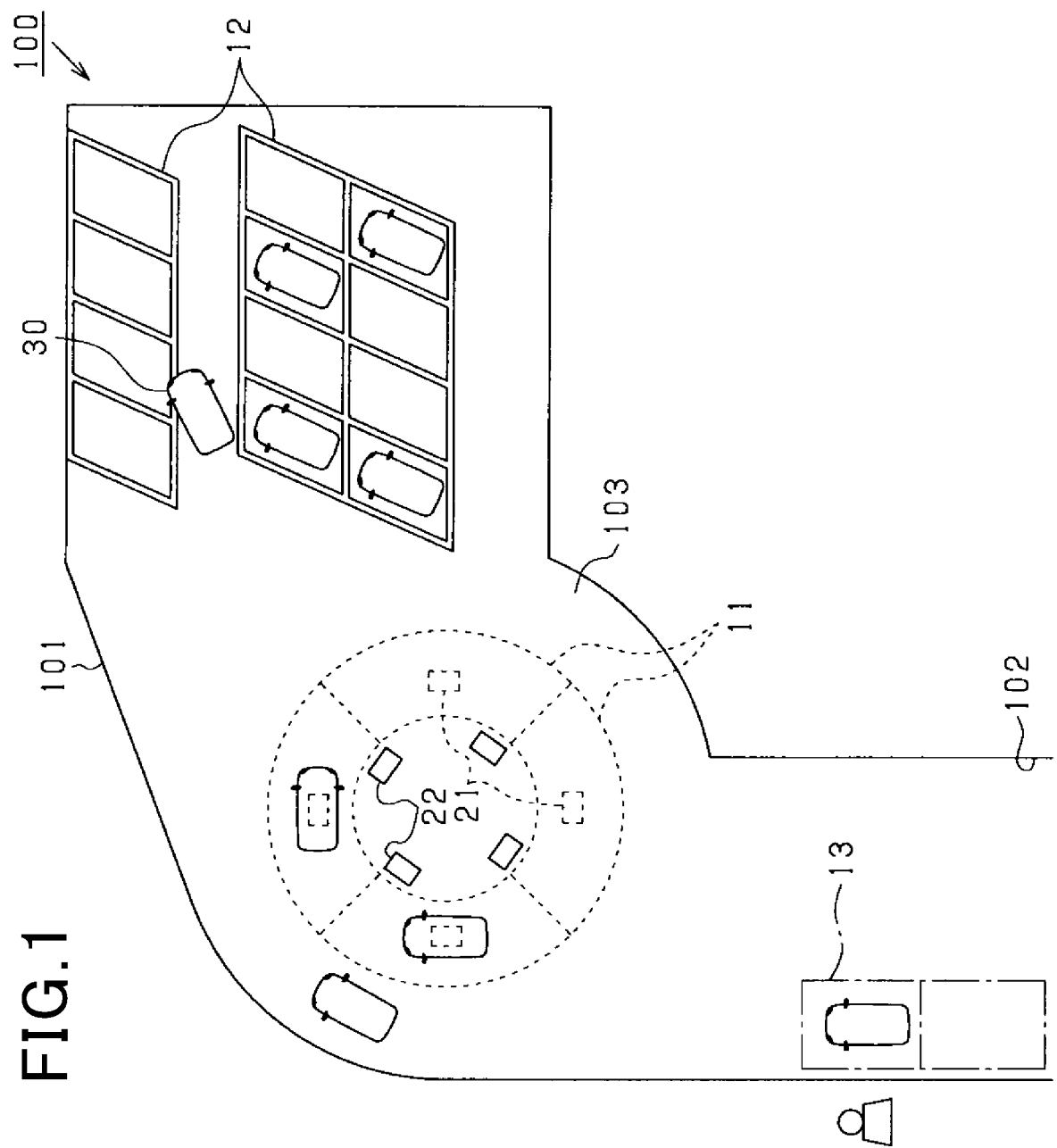
FIG. 1 is a schematic diagram of a configuration of a power supply space region.

The following embodiments of the present disclosure relate to a power supply apparatus that supplies electric power in a contactless manner.

In a contactless power supply system, electric power is supplied to a vehicle, such as an electric car, in a contactless manner through electromagnetic induction. Thus, a storage battery provided in the vehicle is charged. In the contactless power supply system, a high-frequency current is sent to a road-surface-side coil that is provided on a road surface. Electromotive force resulting from electromagnetic induction is generated in a vehicle-side coil that is magnetically coupled with the road-surface-side coil. The storage battery of the vehicle is charged by the electromotive force.

Here, to complete charging of the storage battery as quickly as possible, increasing supplied electric power and thereby increasing electromotive force is desired. However, when large high-frequency power is supplied to increase electromotive force, high intensity electromagnetic waves (an electromagnetic field) may be generated in the periphery of the road-surface-side coil. When these high intensity electromagnetic waves are generated, effects on living bodies (such as humans) present near the coil become a concern.

It is thus desired to provide a power supply apparatus that efficiently and safely supplies electric power to a vehicle.

First Embodiment

An embodiment in which a power supply apparatus of the present disclosure is applied to a contactless power supply system 100 will hereinafter be described with reference to the drawings. Sections among the embodiments below that are identical or equivalent to each other are given the same reference numbers in the drawings.

As shown in FIG. 1, the contactless power supply system 100 is provided on a predetermined sites (premises) 101. In addition, a power supply space 11, a parking space 12, and a waiting space 13 are provided on the sites 101. The power supply space 11 serves as a power supply position at which a vehicle 30 is supplied power. The parking space 12 serves as a parking position at which the vehicle 30 that has been supplied power is parked. The waiting space 13 serves as a waiting position at which the vehicle 30 that is awaiting power supply waits. A plurality of each of the spaces 11 to 13 are provided. Each of the spaces 11 to 13 has a width and a depth that, for example, allows parking of a single vehicle 30.

Furthermore, a vehicle entrance/exit 102 through which the vehicle 30 can enter and exit is provided on the sites 101. A road 103 that connects between the vehicle entrance/exit 102 and each of the spaces 11 to 13 is also provided on the sites 101. The spaces 11 to 13 and the road 103 are paved with asphalt or the like. The spaces 11 to 13 are divided by boundary lines or the like on the road surface. The appearance of the boundary line (such as color, line thickness, or line type) differs depending on the type of the spaces 11 to 13. The spaces 11 to 13 can be differentiated by the appearance of the boundary lines.

For example, the line type refers to differences such as a solid line, a broken line, a single-dot chain line, and a double line. In FIG. 1 according to the present embodiment, the power supply spaces 11 are indicated by the dashed lines. The parking spaces 12 are indicated by the outlined white solid lines. The waiting spaces 13 are indicated by the single-dot chain lines. In addition, although the spaces 11 to 13 are divided by the boundary lines, the spaces 11 to 13 may also be divided by boundary portions such as curb stones.

As shown in FIG. 1, the plurality of power supply spaces 11 are arrayed on the sites 101 in a single row in the form of a circular ring. The plurality of parking spaces 12 are arranged in a position away from the power supply spaces 11 on the sites 101. The plurality of parking spaces 12 are arrayed in a plurality of rows in a linear manner. The plurality of waiting spaces 13 are provided near the power supply spaces 11 on the sites 101. The plurality of waiting spaces 13 are arrayed in a single row in a linear manner.

Next, the contactless power supply system 100 will be described. First, a power supply apparatus 20 will be described with reference to FIG. 1 to FIG. 3. The power supply apparatus 20 is a facility on the power-supply side (power-transmission side) in the contactless power supply system 100.

Figure 2:
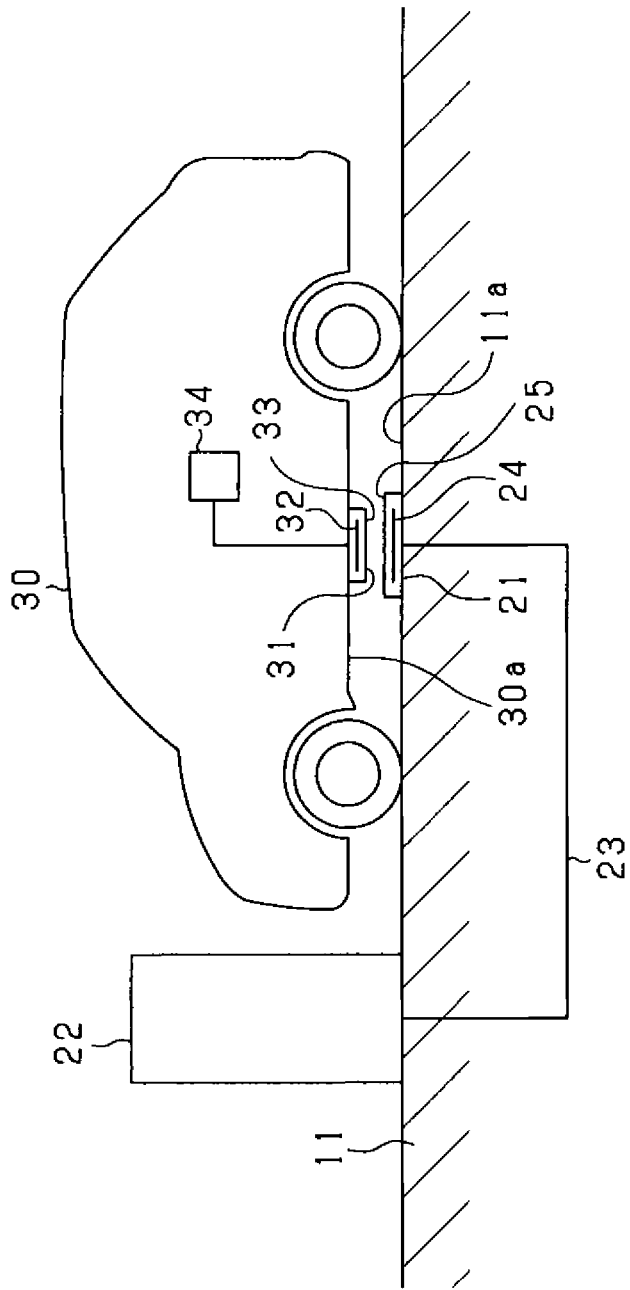
FIG. 2 is a diagram of an arrangement of a power supplying unit and a power receiving unit.

The power supply apparatus 20 provides a function for supplying (transmitting) electric power to the vehicle 30 in a contactless state. Each power supply space 11 is provided with the power supply apparatus 20. As shown in FIG. 2, the power supply apparatus 20 includes a power supplying unit 21 and a power source apparatus 22. The power supplying unit 21 is provided within the power supply space 11. The power source apparatus 22 is provided adjacent to the power supply space 11. The power supplying unit 21 is connected to the power source apparatus 22 via a cable 23.

The power source apparatus 22 converts commercial power (alternating-current power) supplied from an electric power supply unit (not shown) to high-frequency power. The power source apparatus 22 then supplies the converted high-frequency power to the power supplying unit 21 via the cable 23. The power source apparatus 22 is provided on the road 103 in a position that does not obstruct passage of the vehicle 30. The setup location of the power source apparatus 22 may be arbitrarily changed. For example, the power source apparatus 22 may be buried underground. In addition, a plurality of power source apparatuses 22 may be gathered in a single location.

Figure 3:
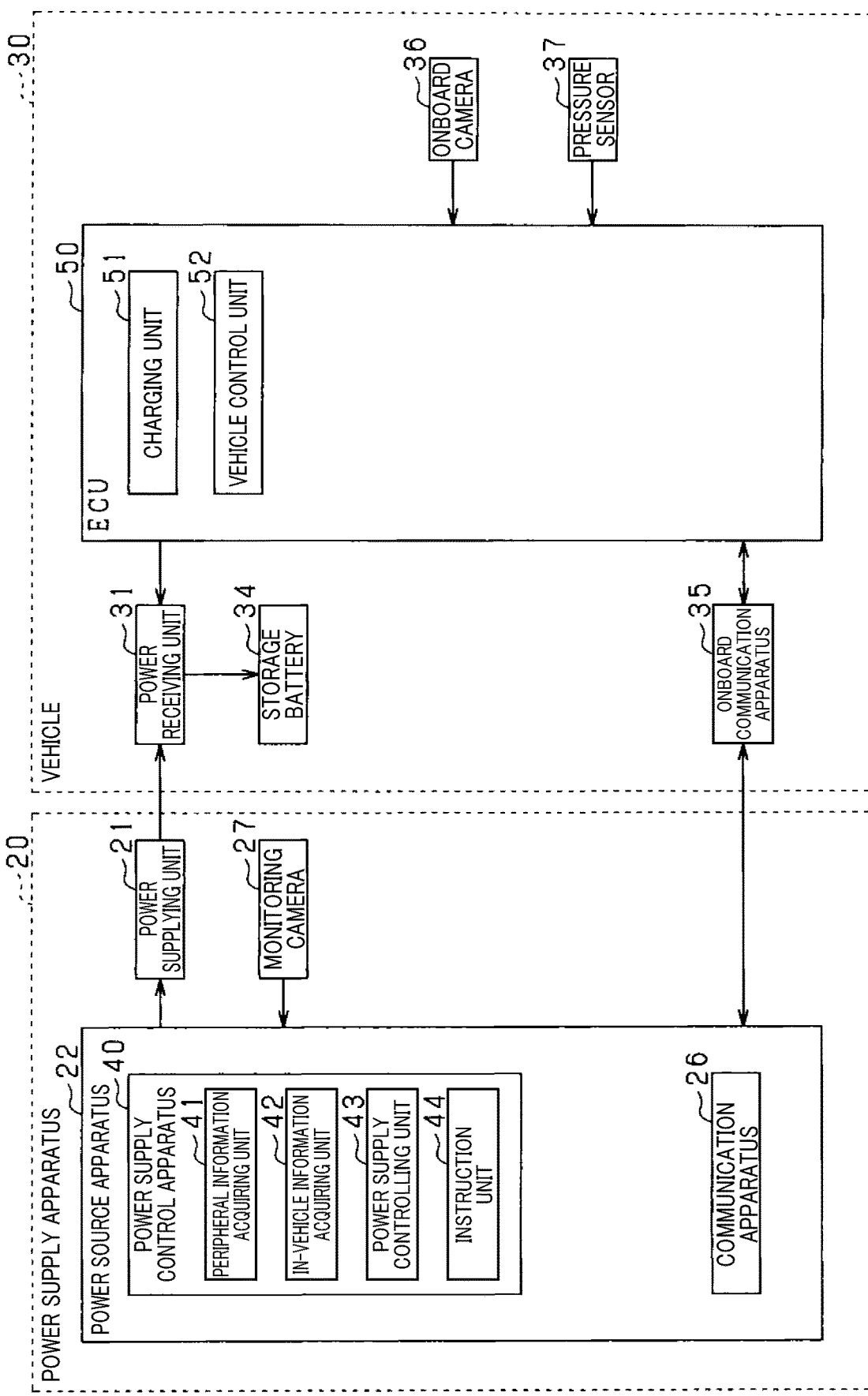
FIG. 3 is a block diagram of a contactless power supply system.

Furthermore, as shown in FIG. 3, the power source apparatus 22 includes a power supply control apparatus 40 that performs various processes, such as processes related to power supply control. The power supply control apparatus 40 is mainly configured by a microcomputer that is composed of a known central processing unit (CPU), read-only memory (ROM), random access memory (RAM), and the like. In addition, the power source apparatus 22 includes a communication apparatus 26 that communicates with the vehicle 30.

As shown in FIG. 2, the power supplying unit 21 is provided on a road surface 11a in each power supply space 11. The power supplying unit 21 is arranged so as to be positioned below (specifically, directly below) a power receiving unit 31 that is provided in the vehicle 30, when the vehicle 30 is parked in the power supply space 11. The power supplying unit 21 includes a power transmission coil 24 and a housing portion 25 that houses the power transmission coil 24. For example, the power transmission coil 24 is formed by a winding (such as litz wire) being wound in a planar shape.

The housing portion 25 is formed into a flat, rectangular box shape. The housing portion 25 has a square shape from a planar view. The housing portion 25 is composed of a non-magnetic material, such as a resin material or aluminum. The power transmission coil 24 is arranged inside the housing portion 25 such that an axial direction of the power transmission coil 24 faces a direction that is orthogonal to an upper surface and a lower surface of the housing portion 25.

A facility on the vehicle 30 side (power-reception side) in the contactless power supply system 100 will be described. According to the present embodiment, as the vehicle 30 that is parked and supplied power on the sites 101, a secondary battery-type battery-powered vehicle, such as an electric car or a plug-in hybrid vehicle (PHV), is assumed.

As shown in FIG. 2, the vehicle 30 has a power receiving unit 31 that serves as the facility on the vehicle 30 side of the contactless power supply system 100. The power receiving unit 31 is provided in a bottom portion 30a of the vehicle 30 (vehicle main body). The power receiving unit 31 includes a power reception coil 32 and a housing portion 33 that houses the power reception coil 32. For example, the power reception coil 32 is formed by a winding (such as litz wire) being wound in a planar shape.

The housing portion 33 is formed into a flat, rectangular box shape. The housing portion 33 has a square shape from a planar view. The housing portion 33 is composed of a non-magnetic material, such as a resin material or aluminum. The housing portion 33 has a planar lower surface.

The housing portion 33 is attached to the bottom portion 30a of the vehicle 30 such that the lower surface is parallel to the bottom portion 30a (bottom surface). In addition, in the attached state, the lower surface of the casing 33 is positioned below the bottom portion 30a of the vehicle 30. The power reception coil 32 is arranged inside the housing portion 33 such that an axial direction of the power reception coil 32 faces a direction that is orthogonal to the lower surface of the housing portion 33.

In addition, as shown in FIG. 3, the vehicle 30 includes a storage battery 34 and an electronic control unit (ECU) 50 that serves as a control apparatus. The ECU 50 is mainly configured by a microcomputer that is composed of a known CPU, ROM, RAM, and the like.

The ECU 50 provides various functions, such as functions as a charging unit 51 and a vehicle control unit 52. The charging unit 51 controls charging of the storage battery 34. The vehicle control unit 52 controls movement of the vehicle 30. The various functions are obtained by the ECU 50 running programs stored in a storage apparatus (storage memory) provided in the ECU 50. The various functions may be obtained by an electronic circuit, which is hardware. Alternatively, at least a portion of the various functions may be obtained by software, that is, a process performed on a computer.

The vehicle 30 travels (or traveling assistance for the vehicle 30 is performed) as a result of an electric motor (not shown) being driven by the electric power stored in the storage battery 34. The vehicle 30 also includes an onboard communication apparatus 35 that communicates with the power source apparatus 22.

Figure 4:
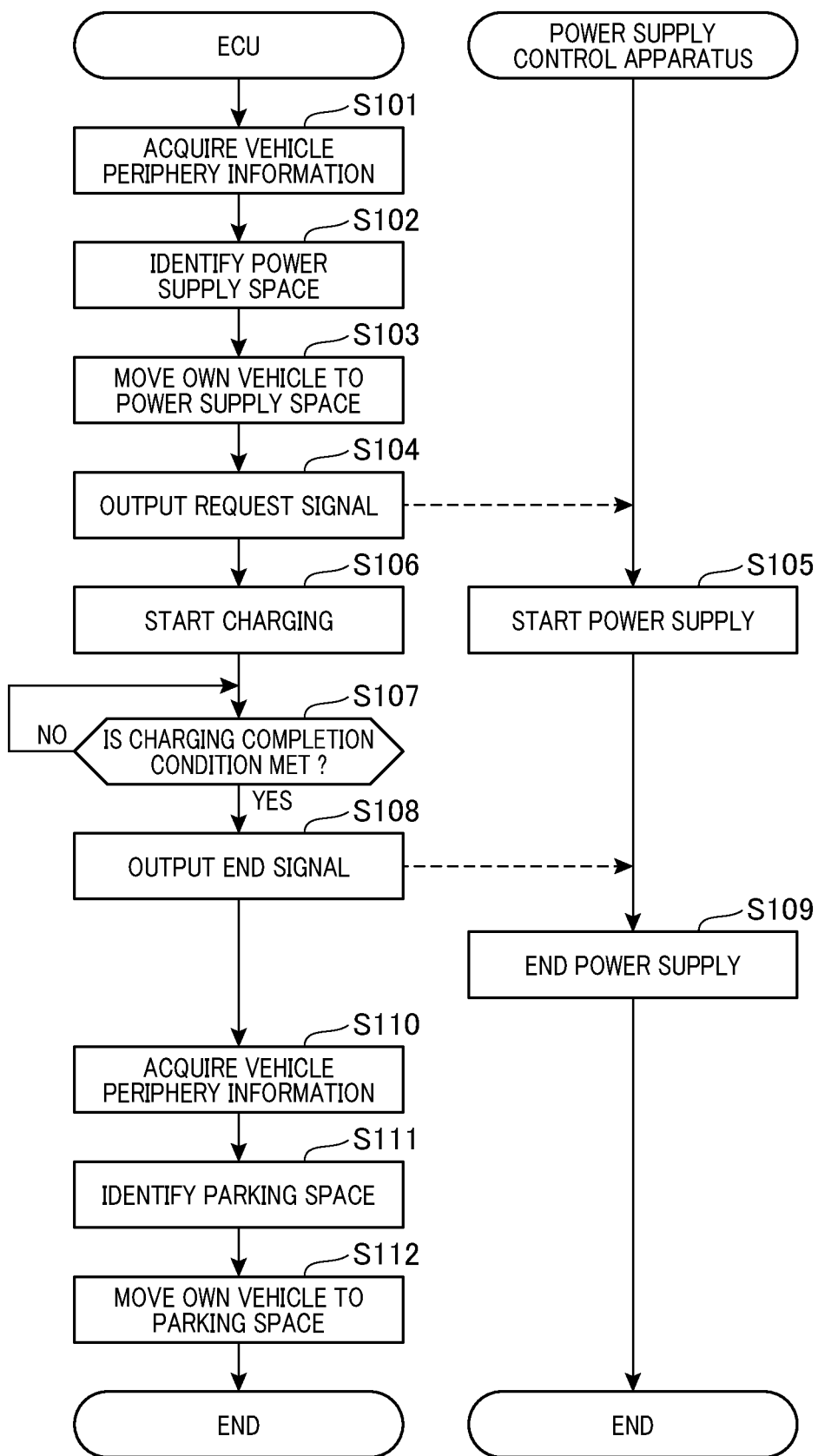
FIG. 4 is a flowchart of a charging process.

Next, a flow of processes that are performed when the storage battery 34 is charged will be described with reference to FIG. 4. When the vehicle 30 (own vehicle) is parked in the waiting space 13, the ECU 50 serving as the vehicle control unit 52 acquires vehicle periphery information (such as a captured image of the own vehicle periphery) from an onboard camera 36 or the like (step S101).

The ECU 50 serving as the vehicle control unit 52 recognizes the power supply spaces 11 and the vehicles 30 (other vehicles) based on the acquired vehicle periphery information, and identifies a power supply space 11 in which no vehicle 30 is parked (step S102).

The vehicle periphery information may be acquired through inter-vehicle communication, communication with the power supply apparatus 22, or the like. In addition, the content of the vehicle periphery information is not limited to the captured images and the like, and is merely required to be information that enables identification of the power supply space 11 in which a vehicle 30 is not parked. For example, the vehicle periphery information may be positional information on the power supply space 11 in which no vehicle 30 is parked.

When the power supply space 11 in which no vehicle 30 is parked is identified, the ECU 50 serving as the vehicle control unit 52 moves the own vehicle to the power supply space 11 and controls the own vehicle so as to be parked in the power supply space 11 (step S103).

Specifically, the ECU 50 recognizes obstacles including people, the vehicles 30 (other vehicles), and the like from the acquired vehicle periphery information, and determines a route to the power supply space 11 taking into consideration the positions of the obstacles. Then, the ECU 50 moves the own vehicle by controlling an accelerator, brakes, a steering wheel, and the like of the own vehicle based on the determined route. When parking the own vehicle in the power supply space 11, the ECU 50 controls the own vehicle so as to be in a state in which the power receiving unit 31 and the power supplying unit 21 oppose each other in an up/down direction.

When there is no power supply space 11 without a vehicle 30, the ECU 50 may perform step S101 again after waiting for a predetermined amount of time.

Then, after parking the own vehicle in the power supply space 11, the ECU 50 serving as the charging unit 51 outputs a request signal for the start of power supply to the power supply control apparatus 40, via the onboard communication apparatus 35 (step S104).

When the request signal is received via the communication apparatus 26 on the power supply apparatus 20 side, the power supply control apparatus 40 controls the power source apparatus 22 so as to start the supply of high-frequency power to the power supplying unit 21 (power transmission coil 24) (step S105).

When the high-frequency power is supplied to the power supplying unit 21 (power transmission coil 24) from the power source apparatus 22 in the state in which the power receiving unit 31 and the power supplying unit 21 are opposing each other in the up/down direction, a current flows to the power transmission coil 24 and magnetic flux is generated in the power transmission coil 24.

Then, as a result of the magnetic flux being changed, electromotive force (voltage) is generated in the power reception coil 32 of the power receiving unit 31 as a result of the effect of electromagnetic induction. As a result, power supply (power transmission) is performed from the power transmission coil 24 to the power reception coil 32 in a contactless manner.

The ECU 50 supplies the electric power supplied to the power reception coil 32 to the storage battery 34 from the power reception coil 32 and starts charging the storage battery 34 (step S106).

After the start of charging, the ECU 50 determines, at every predetermined cycle, whether a charging completion condition is met (step S107). For example, the charging completion condition is determined to be met when a state-of-charge (SOC) of the storage battery 34 is in a target state. In addition, the charging completion condition may be determined to be met when a predetermined prescribed amount of time (such as 30 minutes) has elapsed from when the own vehicle is parked in the power supply space 11.

When determined that the charging completion condition is not met (i.e., a NO determination is made at step S107), the ECU 50 performs the process at step S107 again after the elapse of a predetermined amount of time. Meanwhile, when determined that the charging completion condition is met (i.e., a YES determination is made at step S107), the ECU 50 outputs an end signal via the onboard communication apparatus 35 (step S108). The end signal indicates that charging is completed. When the end signal is received via the communication apparatus 26 on the power supply apparatus 20 side, the power supply control apparatus 40 ends power supply (step S109).

The ECU 50 serving as the vehicle control unit 52 acquires the vehicle periphery information in a manner similar to that described above (step S110). Then, in a manner similar to that described above, the ECU 50 recognizes the parking spaces 12 and the other vehicles 30 based on the vehicle periphery information, and identifies a parking space 12 (predetermined parking position) in which a vehicle 30 is not parked (step S111).

In a manner similar to that described above, when the parking space 12 in which a vehicle 30 is not parked is identified, the ECU 50 serving as the vehicle control unit 52 moves the own vehicle to the parking space 12 and controls the vehicle 30 so as to be parked in the parking space 12 (step S112). As a result of the foregoing, charging is automatically performed. After the charging is completed, the own vehicle is automatically (without driving by a person) moved to the parking space 12.

Here, unlike a power supply apparatus that is set in a residence, the power supply apparatus 20 according to the present embodiment is assumed to be a public facility. Therefore, there is a traffic of living bodies, such as people. Living bodies being present near the power supplying unit 21 and people being aboard the vehicle 30 are possible.

In such cases, when large high-frequency power is supplied to the power transmission coil 24, high intensity electromagnetic waves (an electromagnetic field) are generated in the periphery of the power transmission coil 24. Effects on living bodies (such as people) near the power transmission coil 24 become a concern. Although people are assumed as the living bodies, small animals such as cats, dogs, and birds may also be included.

Therefore, when the power supply control apparatus 40 of the power supply apparatus 20 acquires in-vehicle information that indicates that a living body is present inside the vehicle 30 or peripheral information indicating that a living body is present near the power supplying unit 21, the power supply control apparatus 20 restricts the supplied electric power. Details will be described below.

The power supply control apparatus 40 provides functions as a peripheral information acquiring unit 41, an in-vehicle information acquiring unit 42, and a power supply control unit 43. These various functions are obtained by the power supply control apparatus 40 running programs stored in a storage apparatus (storage memory) provided in the power supply control apparatus 40. The various functions may be obtained by an electronic circuit, which is hardware. Alternatively, at least a portion of the various functions may be obtained by software, that is, a process performed on a computer.

The power supply control apparatus 40 serving as the peripheral information acquiring unit 41 acquires peripheral information from a monitoring camera 27 that detects living bodies present outside of the vehicle 30 and near the power supplying unit 21 during power supply to the vehicle 30.

For example, the monitoring camera 27 captures an image of an area near the power supplying unit 21. The power supply control apparatus 40 then acquires the captured image as the peripheral information. The power supply control apparatus 40 recognizes the presence of a living body, such as a person, by a known method, such as pattern matching, performed on the captured image. Other than the monitoring camera 27, an infrared sensor (infrared camera) that detects a body temperature of a living body or the like may be used to detect the living body near the power supplying unit 21.

The power supply control apparatus 40 serving as the in-vehicle information acquiring unit 42 acquires the in-vehicle information regarding whether a living body is present inside the vehicle 30 during power supply to the vehicle 30. More specifically, a pressure sensor 37 is provided for each seat of the vehicle 30. The pressure sensor 37 detects weight of a passenger.

When the weight of a passenger is detected by the pressure sensor 37 (when weight equal to or greater than a predetermined weight is detected), the ECU 50 outputs a signal indicating that a living body is present inside the vehicle 30, via the onboard communication apparatus 35. The power supply control apparatus 40 acquires the in-vehicle information indicating that a living body is present inside the vehicle 30 by receiving the input of the signal indicating that a living body is present inside the vehicle 30, via the communication apparatus 26.

The method for detecting a living body inside the vehicle 30 is not limited to the above-described method. For example, the ECU 50 may output the signal indicating that a living body is present inside the vehicle 30 when the ignition is turned on. Alternatively, an in-vehicle camera that captures an image of the state inside the vehicle 30 may be provided. The ECU 50 may analyze the image captured by the in-vehicle camera and detect whether a living body is present inside the vehicle 30.

The power supply control apparatus 40 serving as the power supply control unit 43 restricts the supplied electric power when the in-vehicle information indicating that a living body is present inside the vehicle 30 or the peripheral information indicating that a living body is present near the power supplying unit 21 is acquired. That is, the power supply control apparatus 40 performs power supply while reducing the electric power so as to be less than a maximum suppliable electric power. As a result, the high-frequency power supplied to the power transmission coil 24 is restricted.

Here, even should a living body be present inside the vehicle 30, because obstructions, such as the power receiving unit 31 and the bottom portion 30*a* of the vehicle 30, are present between the living body inside the vehicle 30 and the power supplying unit 21, the effects of the electromagnetic waves on the living body inside the vehicle 30 are less than the effects on a living body that is present outside the vehicle 30 near the power supplying unit 21.

More specifically, the power receiving unit 31 is arranged in the bottom portion 30*a* of the vehicle 30 and is arranged below the seat on which the passenger is seated inside the vehicle 30. Therefore, even when the electromagnetic waves are outputted from the power transmission coil 24, a large portion of the electromagnetic waves is used (absorbed) by the power receiving unit 31. Therefore, the effects of the electromagnetic waves on the living body inside the vehicle 30 are less than the effects on a living body that is present outside the vehicle 30 near the power supplying unit 21.

That is, when a living body is not present either inside the vehicle 30 or near the power supplying unit 21 (when the information indicating the presence of a living body is not acquired in a state in which a living body can normally be detected), the power supply control apparatus 40 is not required to consider the effects on living bodies near the power transmission coil 24. Therefore, when a living body is not present inside the vehicle 30 or near the power supplying unit 21, the power supply control apparatus 40 reduces the restriction amount compared to that when a living body is present.

Specifically, when a living body is not present inside the vehicle 30 or near the power supplying unit 21, the power supply control apparatus 40 sets the restriction amount to zero. Furthermore, when the in-vehicle information indicating that a living body is present inside the vehicle 30 is acquired, the power supply control apparatus 40 reduces the restriction amount of the supplied electric power compared to that when the peripheral information indicating that a living body is present near the power supplying unit 21 is acquired.

In addition, even when a living body is present outside the vehicle 30, the effects of the electromagnetic waves generated from the power supplying unit 21 gradually decrease as the distance from the power supplying unit 21 increases. Therefore, when the peripheral information indicating that a living body is present near the power supplying unit 21 is acquired, the power supply control apparatus 40 acquires the distance from the power supplying unit 21 to the living body and determines the restriction amount of the supplied electric power based on the distance from the power supplying unit 21 to the living body.

According to the present embodiment, the ECU 50 recognizes the distance from the power supplying unit 21 to the living body based on the captured image (that is, the peripheral information). Here, an ultrasonic wave sensor or the like may be provided. The distance from the power supplying unit 21 to the living body may then be measured through use of the ultrasonic sensor or the like.

Moreover, when charging is performed while the supplied electric power is restricted over a long period of time, the amount of electric power required for control performed by the power supply control apparatus 40 that is consumed in proportion to time increases. As a result, efficiency becomes poor. Furthermore, time may be required for the charging to be completed. In this case, a single vehicle 30 occupies the power supply apparatus 20 for a long period of time. The power supply apparatus 20 according to the present embodiment is assumed to be a public facility. Use of the power supply apparatus 20 by a plurality of vehicles 30 is assumed. Therefore, when such a situation occurs, issues arise in terms of usage efficiency of the power supply apparatus 20 and fairness.

Therefore, the power supply control apparatus 40 is configured so as to interrupt power supply when an amount of time over which the supplied electric power is restricted reaches a predetermined prescribed amount of time (such as 30 minutes). The prescribed amount of time is determined based on the restriction amount of the supplied electric power. That is, efficiency becomes poorer as the restriction amount of the supplied electric power increases. Therefore, the prescribed amount of time is shortened (so as to 20 minutes) when the restriction amount is large, compared to that when the restriction amount is small.

Traveling of the vehicle may be affected when the power supply is interrupted after the elapse of the prescribed amount of time in a state in which the SOC is less than a predetermined amount. Therefore, the power supply may be interrupted when the SOC is equal to or greater than the predetermined amount and the prescribed amount of time has elapsed. Here, the predetermined amount is preferably a value that is less than the SOC at the target state (the SOC at which the charging completion condition is met) and is an SOC that enables traveling over a predetermined distance.

In addition, to cancel the restriction placed on the supplied electric power and efficiently perform power supply, the power supply control apparatus 40 also provides a function as an instruction unit 44 that outputs an instruction (signal) to urge exit from the vehicle 30 via the communication apparatus 26 when determined that a living body is present inside the vehicle 30. Upon receiving the input of the signal urging exit from the vehicle 30 via the onboard communication apparatus 35, the ECU 50 of the vehicle 30 issues a notification that urges exit from the vehicle 30 using a notifying means such as an onboard speaker.

Figure 5:
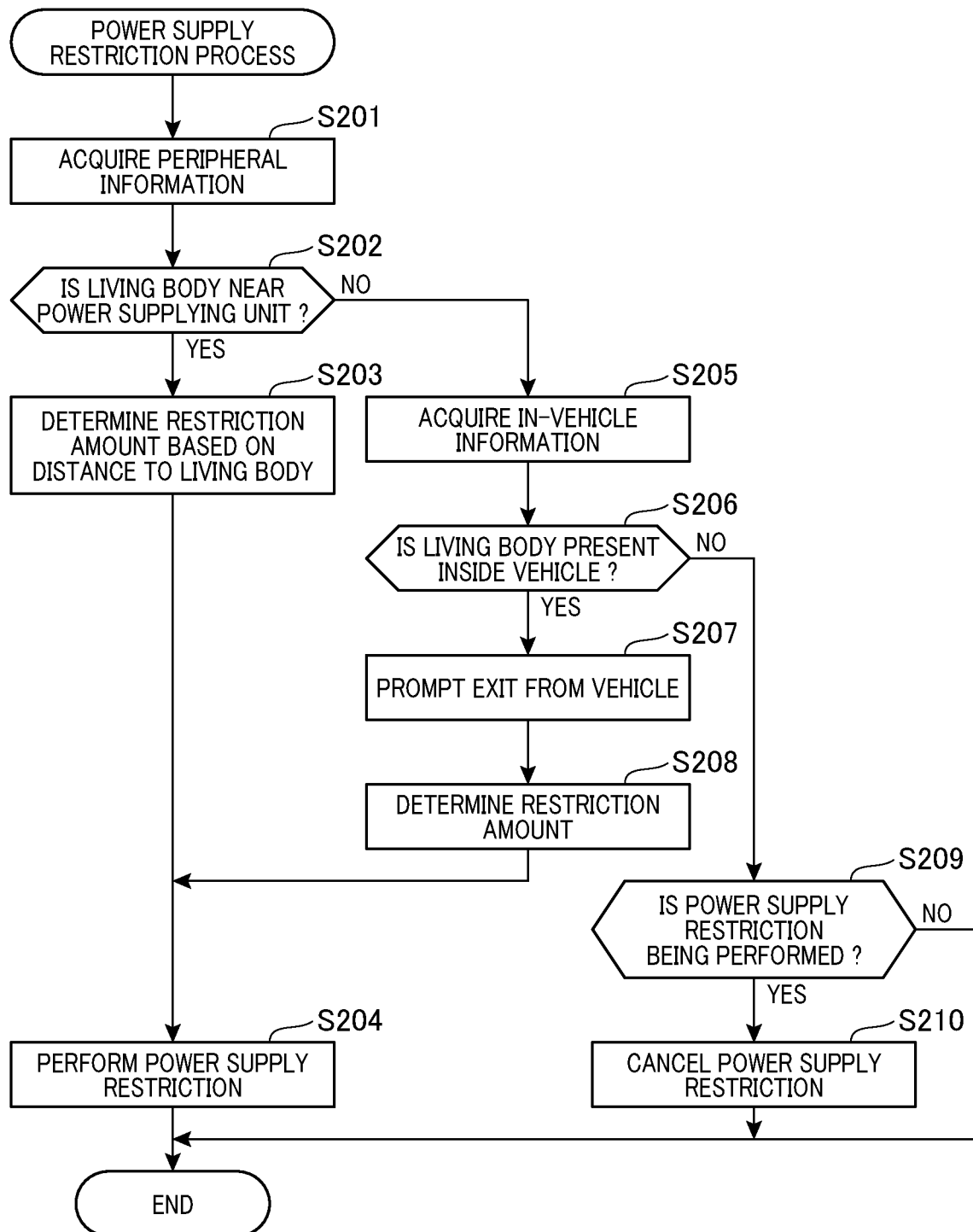
FIG. 5 is a diagram of a flow of a power supply restriction process.

Next, a power supply restriction process for determining the restriction amount of the supplied electric power will be described with reference to FIG. 5. The power supply control apparatus 40 performs the power supply restriction process at every predetermined cycle after the start of power supply (after the process at step S105).

When the power supply restriction process is started, first, the power supply control apparatus 40 acquires the peripheral information from the monitoring camera 27 (S201). Then, the power supply control apparatus 40 determines whether the peripheral information indicating that a living body is present near the power supplying unit 21 is acquired (step S202).

When a YES determination is made at step S202 (i.e., the peripheral information indicating that a living body is present near the power supplying unit 21 is acquired), the power supply control apparatus 40 acquires the distance from the power supplying unit 21 to the living body and determines the restriction amount based on the distance from the power supplying unit 21 to the living body (S203).

Subsequently, the power supply control apparatus 40 restricts the supplied electric power based on the determined restriction amount and performs power supply (step S204). That is, the power supply control apparatus 40 outputs the restricted high-frequency power to the power transmission coil 24. Then, the power supply control apparatus 40 ends the power supply restriction process.

Meanwhile, when a NO determination is made at step S202 (i.e., no peripheral information indicating that a living body is present near the power supplying unit 21 is acquired), the power supply control apparatus 40 acquires the in-vehicle information indicating whether a living body is present inside the vehicle 30 from the vehicle 30 that is being supplied power (step S205). Then, the power supply control apparatus 40 determines whether the in-vehicle information indicating that a living body is present inside the vehicle 30 is acquired (step S206).

When a YES determination is made at S206 (i.e., the in-vehicle information indicating that a living body is present inside the vehicle 30 is acquired), the power supply control apparatus 40 outputs the instruction (signal) to urge exit from the vehicle 30 via the communication apparatus 26 (step S207). In addition, the power supply control apparatus 40 determines the restriction amount when a living body is present inside the vehicle 30 (step S208).

The restriction amount when a living body is present inside the vehicle 30 is less than the restriction amount when a living body is detected near the power supplying unit 21. That is, the supplied electric power is greater when the living body is present inside the vehicle 30, compared to that when the living body is present near the power supplying unit 21. The restriction amount may also be changed based on the number of passengers, weight, the positions of the passengers, and the like.

The power supply control apparatus 40 then proceeds to step S204. The power supply control apparatus 40 restricts the supplied electric power based on the determined restriction amount and performs power supply. The power supply control apparatus 40 subsequently ends the power supply restriction process.

Meanwhile, when a NO determination is made at step S206 (i.e., no in-vehicle information indicating that a living body is present inside the vehicle 30 is acquired), the power supply control apparatus 40 determines whether power supply restriction is being performed (step S209).

When a YES determination is made at step S209 (i.e, power supply restriction is being performed), the power supply control apparatus 40 cancels the power supply restriction (step S210). That is, the power supply control apparatus 40 performs power supply at the maximum electric power. The power supply control apparatus 40 then ends the power supply restriction process.

Meanwhile, when a NO determination is made at step S209 (i.e, no power supply restriction is being performed), the power supply control apparatus 40 immediately ends the power supply restriction process. In this case, restriction of the supplied electric power is not performed.

Next, an interruption process for interrupting the power supply will be described with reference to FIG. 6. The power supply control apparatus 40 performs the interruption process at every predetermined cycle after the power supply restriction is performed (after the process at step S204 is performed), until the power supply restriction is canceled.

The power supply control apparatus 40 acquires an elapsed amount of time that has elapsed from the start of the power supply restriction (that is, from when the process at step S204 is performed) (step S211). Then, the power supply control apparatus 40 determines the prescribed amount of time based on the restriction amount and determines whether the elapsed amount of time exceeds the prescribed amount of time (step S212). For example, the prescribed amount of time is determined to be shorter as the restriction amount increases.

When a YES determination is made at step S212 (i.e., the elapsed amount of time exceeds the prescribed amount of time), the power supply control apparatus 40 interrupts the power supply (step S213) and ends the interruption process. Meanwhile, when a NO determination is made at step S212 (i.e., the elapsed amount of time does not exceed the prescribed amount of time), the power supply control apparatus 40 ends the interruption process.

When the power supply is interrupted as a result of the interruption process, the ECU 50 of the vehicle 30 preferably makes the vehicle 30 exit the power supply space 11. In this case, charging of the vehicle 30 may be resumed after waiting for a predetermined amount of time. Alternatively, the vehicle 30 may be temporarily moved to the waiting space 13.

The following excellent effects can be achieved as a result of the above-described configuration.

The power supply control apparatus 40 restricts the supplied electric power when the in-vehicle information indicating that a living body is present inside the vehicle 30 is acquired or when the peripheral information indicating that a living body is present near the power supplying unit 21 is acquired. Therefore, power supply can be safely performed even when the supplied electric power is increased when a living body is not present. That is, power supply can be efficiently and safely performed.

Here, even when a living body is present inside the vehicle 30, because obstructions, such as the power receiving unit 31, are present between the living body inside the vehicle 30 and the power supplying unit 21, the effects of electromagnetic waves on the living body inside the vehicle 30 are less than the effects on a living body that is present near the power supplying unit 21.

Therefore, when the in-vehicle information indicating that a living body is present inside the vehicle 30 is acquired, the power supply control apparatus 40 reduces the restriction amount of the supplied electric power, compared to that when the peripheral information indicating that a living body is present near the power supplying unit 21 is acquired. Consequently, power supply can be safely and efficiently performed even when a living body is present inside the vehicle 30.

In addition, the effects of the electromagnetic waves (electromagnetic field) differ depending on the distance from the power supplying unit 21 to the living body. Therefore, when the peripheral information indicating that a living body is present near the power supplying unit 21 is acquired, the power supply control apparatus 40 determines the restriction amount based on the distance from the power supplying unit 21 to the living body. Consequently, power supply can be safely and efficiently performed even when a living body is present near the power supplying unit 21.

Furthermore, performing power supply while restricting the supplied electric power over a long period of time results in poor efficiency. In particular, in the case of the power supply apparatus 20 that is assumed to be used by a plurality of vehicles 30 as according to the present embodiment, issues also arise in terms of fairness. Therefore, the power supply control apparatus 40 interrupts the power supply when the amount of time over which the supplied electric power is restricted reaches the predetermined prescribed amount of time. Consequently, the plurality of vehicles 30 can efficiently and fairly use the power supply apparatus 20.

Furthermore, the amount of time required for power supply becomes longer as the restriction amount increases, thereby resulting in poor efficiency. Therefore, the power supply control apparatus 40 determines the prescribed amount of time based on the restriction amount. Consequently, the power supply can be promptly interrupted, thereby improving efficiency.

The power supply control apparatus 40 provides the function as the instruction unit 44 that outputs the instruction to urge exit from the vehicle 30 when determined that a living body is present inside the vehicle 30. Consequently, the passenger exiting the vehicle 30 and the restriction placed on the supplied electric power being canceled can be expected. That is, the likelihood of efficient charging being performed can be enhanced.

Second Embodiment

According to a second embodiment, the power supply control apparatus 40 serving as the peripheral information acquiring unit 41 is configured to acquire peripheral information regarding a position of another vehicle, presence/absence of a living body inside the other vehicle, and presence/absence of a living body outside the other vehicle near the other vehicle, based on communication with the other vehicle. The other vehicle is a vehicle 30 other than the vehicle 30 that is being subjected to power supply.

The peripheral information acquired from the monitoring camera 27 is referred to as first peripheral information. Meanwhile, the peripheral information regarding the position of another vehicle, the presence/absence of a living body inside the other vehicle, and the presence/absence of a living body outside the other vehicle near the other vehicle, based on communication with the other vehicle is referred to as second peripheral information.

For example, regarding the presence of a living body outside the other vehicle near the other vehicle, a control apparatus of the other vehicle may perform detection using a captured image from a camera or the like that is mounted in the other vehicle. The control apparatus of the other vehicle may then include the detection result in the second peripheral information and output the second peripheral information.

In addition, for example, regarding the presence/absence of a living body inside the other vehicle, the control apparatus of the other vehicle may perform detection using a detection signal from a pressure sensor provided in each seat of the other vehicle or the like. The control apparatus of the other vehicle may then include the detection result in the second peripheral information and output the second peripheral information. Here, the control apparatus of the other vehicle may include the captured image and the detection result from the sensor in the second peripheral information, and the power supply control apparatus 40 may make the determination.

In addition, the power supply control apparatus 40 is configured to determine whether a person (living body) is present inside another vehicle near the power supplying unit 21 based on the second peripheral information. Furthermore, the power supply control apparatus 40 is configured to determine whether a living body is present outside the vehicle 30 near the power supplying unit 21 based on the first peripheral information and the second peripheral information.

When a person (living body) is determined to be present inside another vehicle near the power supplying unit 21, the power supply control apparatus 40 reduces the restriction amount compared to that when a living body is determined to be present outside the vehicle 30 near the power supplying unit 21.

In addition, the power supply control apparatus 40 serving as the peripheral information acquiring unit 41 is configured to acquire information related to the state of another vehicle based on communication with the other vehicle. For example, the information related to the state of another vehicle refers to information regarding presence/absence of the power receiving unit 31 in the other vehicle and whether the other vehicle is receiving power supply.

Then, when determined that a person (living body) is present inside another vehicle near the power supplying unit 21, the power supply control apparatus 40 varies the restriction amount based on the state of the other vehicle. That is, when the other vehicle is a vehicle 30 in which shielding against the electromagnetic waves from the power supplying unit 20 is not taken into consideration (when the vehicle is not equipped with a shield material or the like that shields against electromagnetic waves or does not have a vehicle structure that shields against electromagnetic waves), the effects of the electromagnetic waves tend to be greater compared to that when consideration is given to shielding against electromagnetic waves.

Whether consideration is given to shielding against electromagnetic waves can be determined by information indicating that consideration is given being acquired through communication, or by whether the power receiving unit 31 is mounted in the other vehicle. That is, when the power receiving unit 31 is mounted in the other vehicle, shielding against the electromagnetic waves from the power supplying unit 20 is very likely to be taken into consideration. Therefore, the determination can be made based on the presence/absence of the power receiving unit 31.

That is, in the case of the vehicle 30 in which the power receiving unit 31 is not mounted, the effects of the electromagnetic waves tend to be greater than that in the vehicle 30 in which the power receiving unit 31 is mounted. Therefore, when determined that a person (living body) is present inside another vehicle near the power supplying unit 21 and the power receiving unit 31 is not mounted in the other vehicle 30, the power supply control apparatus 40 reduces the restriction amount compared to that when the power receiving unit 31 is mounted.

In addition, when power reception is stopped, an energy conversion amount (an amount converted to energy) of the electromagnetic waves resulting from power reception decreases. As a result, the effects on passengers may increase. Therefore, when determined that a person (living body) is present inside another vehicle near the power supplying unit 21, and the power receiving unit 31 is in operation in the other vehicle 30, the power supply control apparatus 40 reduces the restriction amount compared to that when the power receiving unit 31 is stopped.

Figure 7:
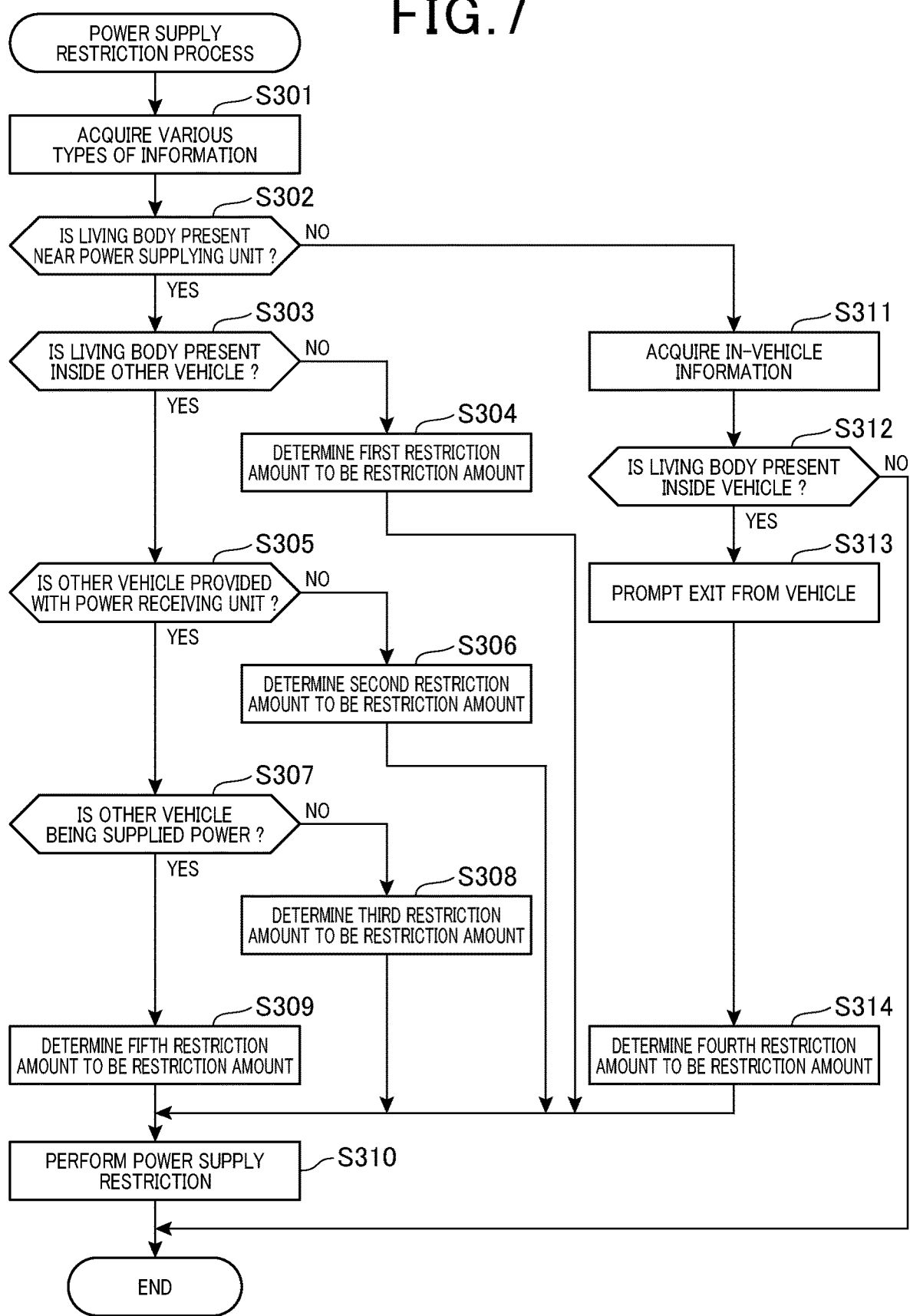
FIG. 7 is a diagram of a flow of the power supply restriction process according to a second embodiment.

Next, the power supply restriction process according to the second embodiment will be described with reference to FIG. 7. The power supply control apparatus 40 performs the power supply restriction process at every predetermined cycle after the start of power supply (after the process at step S105).

When the power supply restriction process is started, first, the power supply control apparatus 40 acquires the first peripheral information from the monitoring camera 27 (step S301). In addition, at step S301, the power supply control apparatus 40 acquires the second peripheral information based on communication with another vehicle. Furthermore, at step S301, the power supply control apparatus 40 acquires the information related to the state of the other vehicle based on communication with the other vehicle.

Then, the power supply control apparatus 40 determines whether the peripheral information indicating that a living body is present near the power supplying unit 21 is acquired (step S302). Specifically, the power supply control apparatus 40 makes a YES determination at step S302 when the first peripheral information indicating that a living body is present near the power supplying unit 21 or the second peripheral information indicating that a living body is present inside another vehicle near the power supplying unit 21 is acquired, or when the second peripheral information indicating that a living body is present outside another vehicle near the power supplying unit 21 is acquired.

When a YES determination is made at step S302 (i.e., the peripheral information indicating that a living body is present near the power supplying unit 21 is acquired), the power supply control apparatus 40 determines whether a living body is present inside another vehicle near the power supplying unit 21 (step S303). Specifically, the power supply control apparatus 40 makes a YES determination at step S303 when only the second peripheral information indicating that a living body is present inside another vehicle near the power supplying unit 21 is acquired.

Meanwhile, the power supply control apparatus 40 makes a NO determination at step S303 when the second peripheral information indicating that a living body is present inside another vehicle near the power supplying unit 21 is not acquired. That is, the power supply control apparatus 40 makes a NO determination at step S303 when the first peripheral information indicating that a living body is present outside the vehicle 30 near the power supply unit 21 is acquired or when the second peripheral information indicating that a living body is present outside another vehicle near the power supplying unit 21 is acquired.

When a NO determination is made at step S303 (i.e., no living body is present inside another vehicle near the power supplying unit 21), the power supply control apparatus 40 determines a first restriction amount to be the restriction amount (step S304). The first restriction amount is a largest restriction amount among restriction amounts.

When a YES determination is made at step S303 (i.e., a living body is present inside another vehicle near the power supplying unit 21), the power supply control apparatus 40 determines whether the power receiving unit 31 is provided in the other vehicle (the vehicle 30 inside of which the living body is present) based on the information related to the state of the other vehicle (step S305).

When a NO determination is made at step S305 (i.e., the power receiving unit 31 is not provided in the other vehicle), the power supply control apparatus 40 determines a second restriction amount to be the restriction amount (step S306). The second restriction amount is less than the first restriction amount.

When a YES determination is made at step S305 (i.e., the power receiving unit 31 is provided in the other vehicle), the power supply control apparatus 40 determines whether the power receiving unit 31 of the other vehicle is in operation based on the information related to the state of the other vehicle (step S307). When a NO determination is made at step S307 (i.e., the power receiving unit 31 of the other vehicle is not in operation), the power supply control apparatus 40 determines a third restriction amount to be the restriction amount (step S308). The third restriction amount is less than the first restriction amount and the second restriction amount.

Meanwhile, when a YES determination is made at step S307 (i.e., the power receiving unit 31 of the other vehicle is in operation), the power supply control apparatus 40 determines a fifth restriction amount to be the restriction amount (step S309). The fifth restriction amount is less than the first restriction amount, the second restriction amount, and the third restriction amount.

After determining the restriction amount (after performing step S304, S306, S308, or S309), the power supply control apparatus 40 restricts the supplied electric power based on the determined restriction amount and performs power supply (step S310). The power supply control apparatus 40 subsequently ends the power supply restriction process.

Meanwhile, when a NO determination is made at step S302 (i.e., no peripheral information indicating that a living body is present near the power supplying unit 21 is acquired), the power supply control apparatus 40 acquires the in-vehicle information regarding whether a living body is present inside the vehicle 30, from the vehicle 30 that is being supplied power (step S311). Then, the power supply control apparatus 40 determines whether the in-vehicle information indicating that a living body is present inside the vehicle 30 is acquired (step S312).

When a YES determination is made at step S312 (i.e., the in-vehicle information indicating that a living body is present inside the vehicle 30 is acquired), the power supply control apparatus 40 outputs the instruction (signal) to urge exit from the vehicle 40 via the communication apparatus 26 (step S313).

In addition, the power supply control apparatus 40 determines a fourth restriction amount to be the restriction amount (step S314). The fourth restriction amount is less than the third restriction amount and greater than the fifth restriction amount. That is, the restriction amount becomes smaller in order from the first restriction amount, the second restriction amount, the third restriction amount, the fourth restriction amount, to the fifth restriction amount.

Then, the power supply control apparatus 40 proceeds to step S310. The power supply control apparatus 40 restricts the supplied electric power based on the determined restriction amount and performs power supply. The power supply control apparatus 40 subsequently ends the power supply restriction process.

Here, when a NO determination is made at step S312 (i.e., no in-vehicle information indicating that a living body is present inside the vehicle 30 is acquired), the power supply control apparatus 40 may perform the processes corresponding to steps S209 and S210 in a manner similar to that according to the first embodiment. In addition, the first restriction amount, the second restriction amount, the third restriction amount, and the fifth restriction amount may be varied depending on the distance to the power supplying unit 21, in a manner similar to that according to the first embodiment. Furthermore, the third restriction amount may be less than the fourth restriction amount.

The following excellent effects can be achieved as a result of the above-described configuration.

Even when a living body is present near the power supplying unit 21, the effects of the electromagnetic waves differ depending on whether the living body is present inside another vehicle. Therefore, even when a living body is determined to be present near the power supplying unit 21, the power supply control apparatus 40 reduces the restriction amount when the living body is present inside another vehicle, compared to that when the living body is present outside the vehicle 30. Consequently, power supply can be safely and efficiently performed.

Even when a living body is present inside another vehicle near the power supplying unit 21, the effects of the electromagnetic waves differ depending on whether the power receiving unit 31 is provided in the other vehicle. Therefore, even when a living body is determined to be present inside another vehicle near the power supplying unit 21, the power supply control apparatus 40 reduces the restriction amount when the power receiving unit 31 is provided in the other vehicle, compared to that when the power receiving unit 31 is not provided. Consequently, power supply can be safely and efficiently performed.

Even when a living body is present inside another vehicle near the power supplying unit 21, the effects of the electromagnetic waves differ depending on whether the power receiving unit 30 in the other vehicle 30 is in operation. Therefore, even when a living body is determined to be present inside another vehicle near the power supplying unit 21, the power supply control apparatus 40 reduces the restriction amount when the power receiving unit 30 in the other vehicle 30 is in operation, compared to that when the power receiving unit 30 is stopped. Consequently, power supply can be safely and efficiently performed.

The effects of the electromagnetic waves are considered to be less when the living body is present inside another vehicle in which the power receiving unit 31 is in operation, compared to that when the living body is present inside the own vehicle that is receiving power supply. Therefore, the restriction amount is reduced when the living body is present inside another vehicle of which the power receiving unit 31 is in operation, compared to that when the living body is present inside the own vehicle that is receiving power supply. Consequently, power supply can be safely and efficiently performed.

Other Embodiments

The present disclosure is not limited to the above-described embodiments. For example, the present disclosure may be carried out as described below. Hereafter, sections that are identical or equivalent to each other among the embodiments are given the same reference numbers. Descriptions of sections having the same reference numbers are applicable therebetween.

According to the above-described embodiment, when a vacant parking space 12 is not present (or a vacant parking space 12 cannot be identified) when the vehicle 30 is to be moved to the parking space 12, the vehicle 30 may wait while remaining in the power supply space 11. In addition, the vehicle 30 may temporarily exit the power supply space 11 and continuously travel on the road 103 until a vacant parking space 12 is identified. This also similarly applies when the vehicle 30 is to be moved to the waiting space 13 or the power supply space 11.

Figure 8:
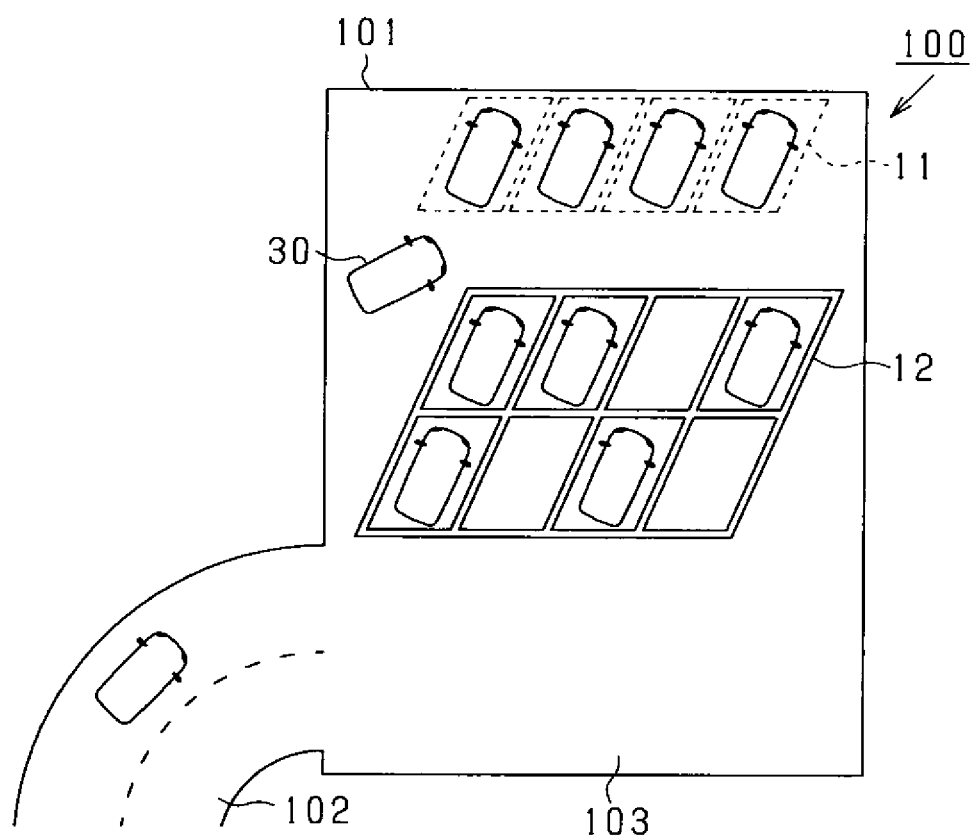
FIG. 8 is a schematic diagram of a configuration of the power supply space region in another example.
Figure 9:
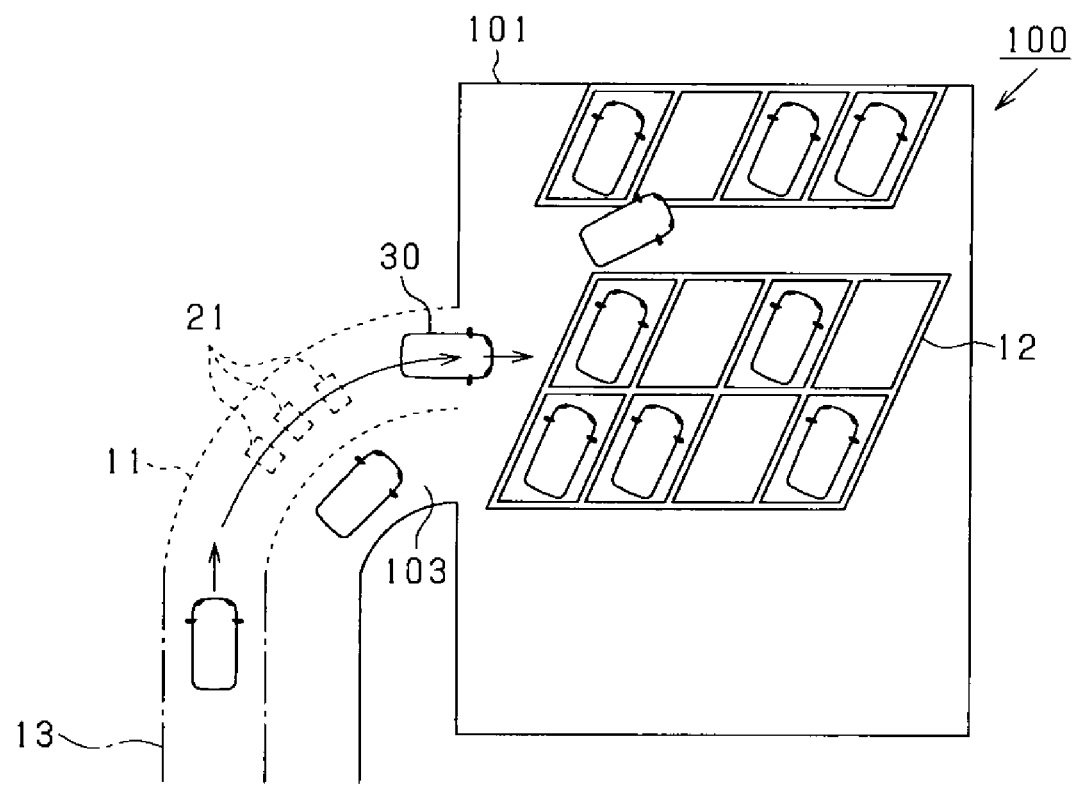
FIG. 9 is a schematic diagram of a configuration of the power supply space region in another example.

According to the above-described embodiments, the waiting space 13 is provided. However, as shown in FIG. 8, the waiting space 13 may not be provided. In this case, the vehicle 30 may be parked in the power supply space 11 as a result of driving by a person. In addition, the vehicle 30 that is awaiting power supply may be parked in the parking space 12 or may continuously travel on the road 103. Then, when a power supply space 11 becomes vacant, the vehicle 30 may be moved to the power supply space 11.

In these cases, the presence/absence of waiting vehicles and the number of waiting vehicles can no longer be identified through captured images. In this case, for example, the presence/absence of waiting vehicles and the number of waiting vehicles may be made identifiable through inter-vehicle communication or a specific signal (such as a lamp).

According to the above-described embodiments, the types of the spaces 11 to 13 are differentiated based on the aspects of the boundary portions, such as the boundary lines. However, the types of the spaces 11 to 13 may be differentiated using road markings, signs, and the like. In addition, in a similar manner, road markings, signs, or the like indicating vacant spaces 11 to 13 may be made identifiable based on captured images from a camera or the like.

According to the above-described embodiments, the vehicle 30 is parked in the power supply space 11 and supplied power. However, the vehicle 30 may be supplied power while moving. In this case, as shown in FIG. 6, a driving route may be provided within the power supply space 11, and a plurality of power supplying units 21 may be arranged along the driving route.

Figure 10:
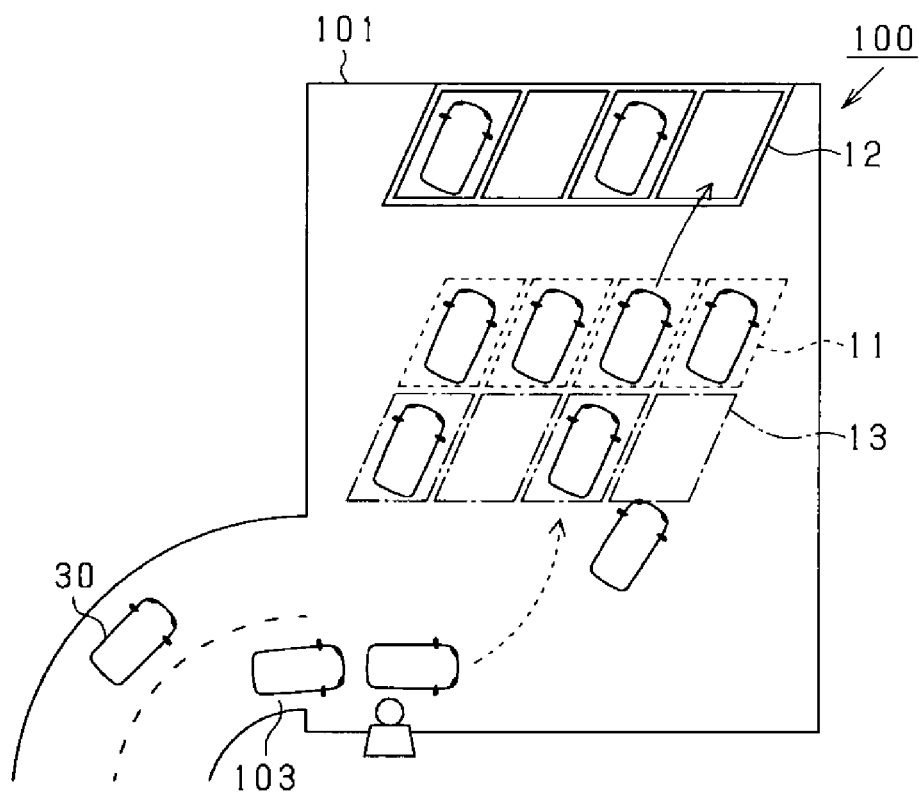
FIG. 10 is a schematic diagram of a configuration of the power supply space region in another example.

According to the above-described embodiments, the arrangement and layout of the spaces 11 to 13 may be arbitrarily changed. The quantities of the spaces 11 to 13 may also be arbitrarily changed. For example, the spaces 11 to 13 may be arranged as shown in FIG. 10.

Figure 11:
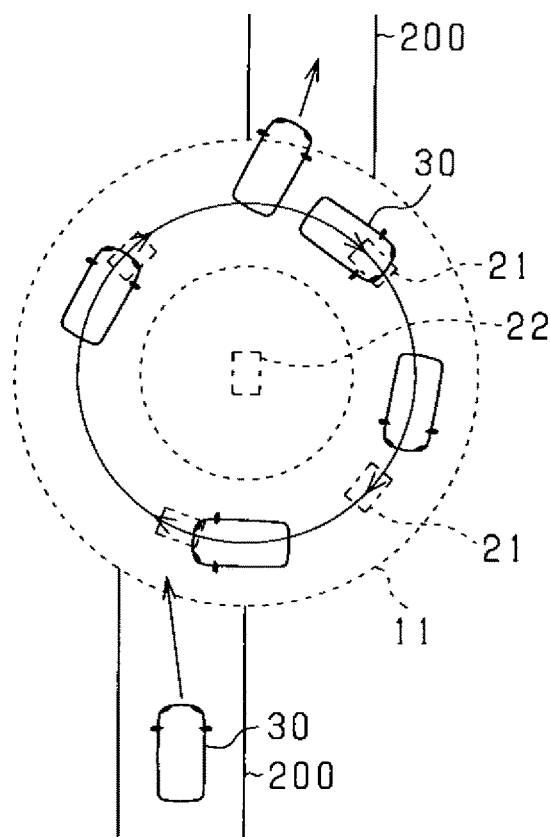
FIG. 11 a schematic diagram of a configuration of the power supply space region in another example.

According to the above-described embodiments, as shown in FIG. 11, the power supply space 11 may be provided so as to be arranged in a ring shape amidst a road 200.

Figure 12:
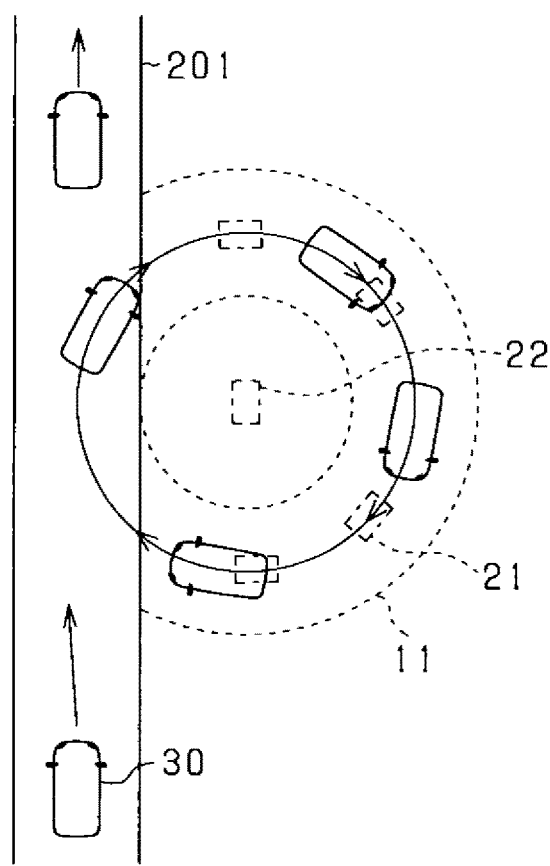
FIG. 12 is a schematic diagram of a configuration of the power supply space region in another example.

In addition, as shown in FIG. 12, the power supply space 11 may be provided so as to be arranged in a ring shape on a linear road 201. In the case shown in FIG. 12, the linear road 201 is provided along a tangent line of the power supply space 11 that is arranged in a circular ring shape. Here, in the case shown in FIG. 12, the road 201 overlaps with a portion of the power supply space 11. The power supplying unit 21 is not disposed on the road 201. That is, in actuality, in the case shown in FIG. 12, a circular arc-shaped power supply space 11 is provided.

Figure 13:
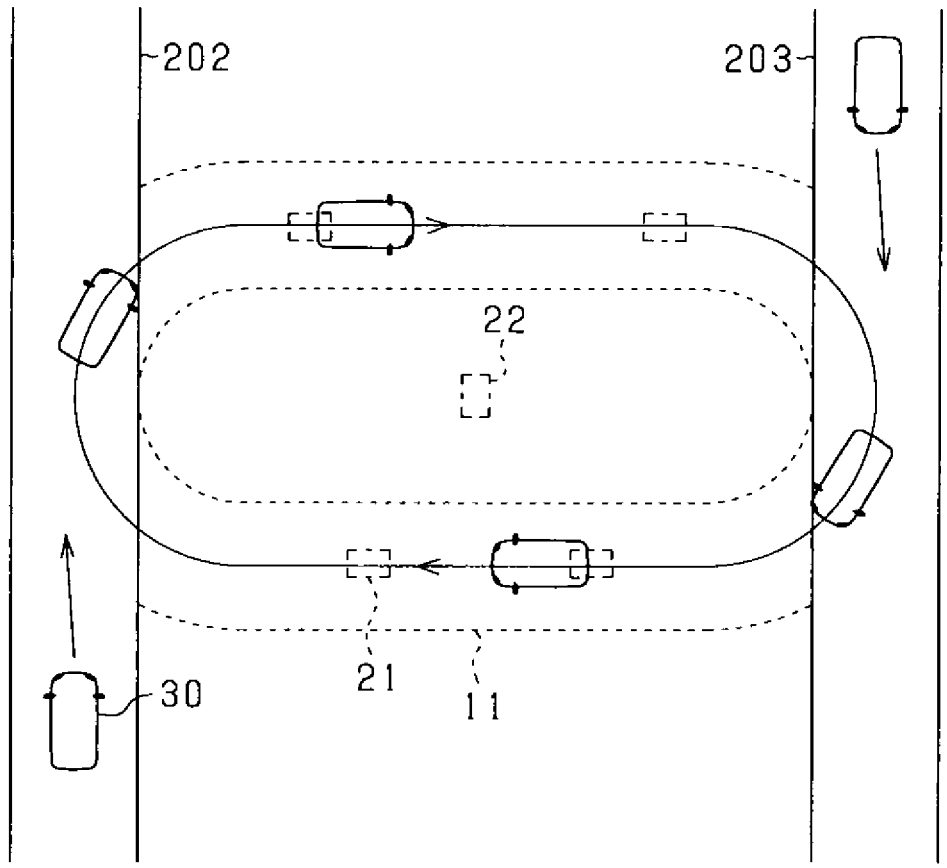
FIG. 13 is a schematic diagram of a configuration of the power supply space region in another example.

Furthermore, as shown in FIG. 13, the power supply space 11 may be provided so as to be arranged in an elliptical shape between two roads 202 and 203 that are provided in parallel. In the case shown in FIG. 13, the roads 202 and 203 are provided along tangent lines of circular arc portions of the power supply space 11 that is arranged in an elliptical shape. Here, in the case shown in FIG. 13, the roads 202 and 203 each overlap a portion of the power supply space 11. The power supplying unit 21 is not disposed on the roads 202 and 203.

In the cases shown in FIG. 12 and FIG. 13, the configuration can be such that only the vehicles 30 that require power supply circle the power supply space 11. The vehicles 30 that do not require power supply can exit onto the road 201, 202, or 203. Here, the power supply unit 21 is not disposed in the portions of the roads 201 to 203 that overlap with the power supply space 11. Therefore, traveling speed of the vehicle 30 can be increased on the roads 201 to 203. The vehicle 30 that is receiving power supply can be prevented from obstructing travel.

According to the above-described embodiments, the vehicle 30 may be parked in the power supply space 11 by being driven by a person.

According to the above-described embodiments, the power supplying unit 21 is provided for each power source apparatus 22. However, a plurality of power supplying units 21 may be provided for a single power source apparatus 22. The power supply control apparatus 40 of the single power source apparatus 22 may control the plurality of power supplying units 21 and simultaneously perform power supply for a plurality of vehicles 30.

According to the above-described embodiments, the charging completion condition may be arbitrarily set. For example, the charging completion condition may be met when a predetermined completion time has elapsed from when the own vehicle is parked in the power supply space 11. In addition, for example, the charging completion condition may be met when the SOC of the storage battery 34 improves by a predetermined amount.

According to the above-described embodiments, the power supply apparatus 20 may determine whether to allow power supply when the request signal is received. For example, the power supply apparatus 20 may not allow power supply when a living body is present inside the vehicle 30 or when a living body is detected near the power supplying unit 21.

Figure 6:
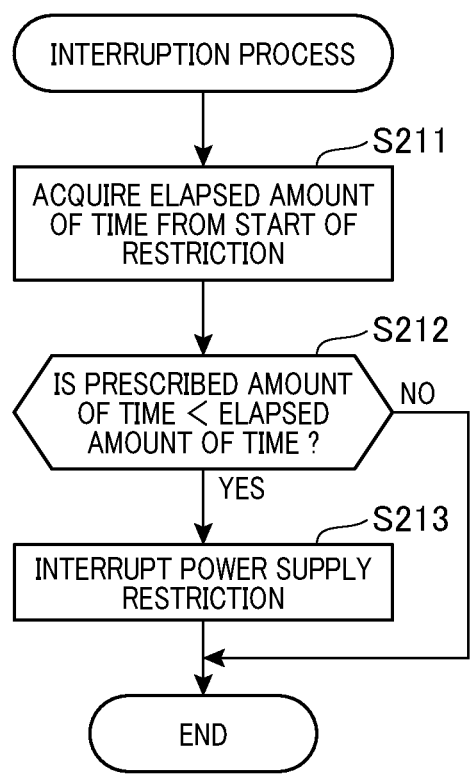
FIG. 6 is a flowchart of an interruption process.
Figure 14:
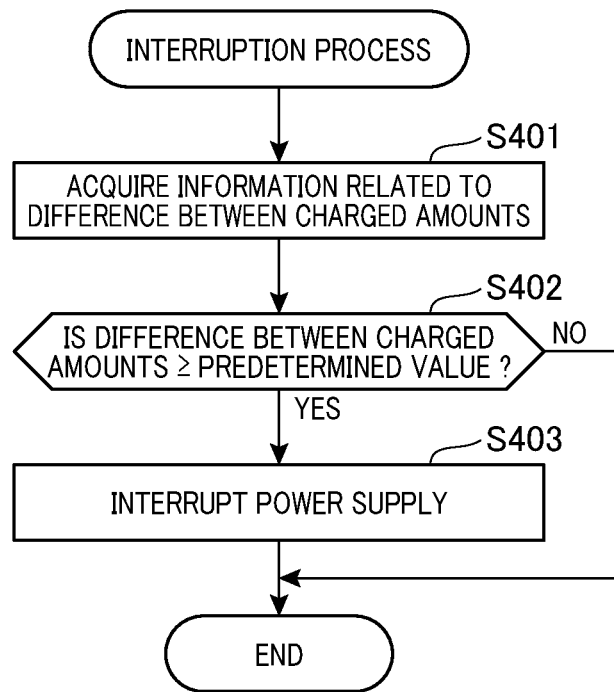
FIG. 14 is a flowchart of the interruption process in another example.

According to the above-described embodiments, an interruption process shown in FIG. 14 may be performed instead of the interruption process shown in FIG. 6. Alternatively, the interruption process shown in FIG. 14 may be performed together with the interruption process shown in FIG. 6. The interruption process shown in FIG. 14 will be described.

In the interruption process shown in FIG. 14, after the start of power supply restriction (that is, after the process at step S204 is performed), the power supply control apparatus 40 acquires information related to a difference between a current charged amount (SOC) and a target charged amount (SOC) of the storage battery 34 from the ECU 50 of the vehicle 30, via the communication apparatus 26 (S401). Therefore, the power supply control apparatus 40 provides a function as a charged amount acquiring unit. Here, should the difference between the current charged amount (SOC) and the target charged amount (SOC) of the storage battery 34 be identifiable, information related to the current charged amount (SOC) of the storage battery 34 may be acquired.

The power supply control apparatus 40 determines whether the difference between the current charged amount and the target charged amount is equal to or greater than a predetermined value (step S402). When a YES determination is made at step S402 (i.e., the difference between the current charged amount and the target charged amount is equal to or greater than the predetermined value), the power supply control apparatus 40 interrupts the power supply (step S403) and ends the interruption process. Meanwhile, when a NO determination is made at step S402 (i.e., the difference between the current charged amount and the target charged amount is smaller than the predetermined value), the power supply control apparatus 40 ends the interruption process.

That is, the power supply control apparatus 40 interrupts the power supply when the in-vehicle information indicating that a living body is present inside the vehicle 30 or the peripheral information indicating that a living body is present near the power supplying unit 21 is acquired, and the difference between the current charged amount and the target charged amount is equal to or greater than the predetermined value.

Therefore, power supply can be interrupted when the difference between the current charged amount and the target charged amount is significant, and power supply is expected to be performed over a long period of time while restriction is placed on the supplied electric power. Consequently, inefficient power supply can be prevented. Here, the power supply control apparatus 40 may determine the predetermined value based on the restriction amount. For example, the predetermined value may be set to a lower value as the restriction amount increases.

According to the above-described embodiments, the power supply control apparatus 40 issues the instruction to urge exit from the vehicle 30. However, the power supply control apparatus 40 is not required to issue the instruction. In addition, the power supply control apparatus 40 may issue a notification that urges evacuation from a speaker or the like, when a living body is present near the power supplying unit 21.

According to the above-described embodiments, the power supply apparatus 20 may include a notifying unit, such as a speaker or a lamp, that gives notification that power supply is being performed when the vehicle 30 is receiving power supply. In this case, the notifying unit may change a notification aspect based on the restriction amount of the supplied electric power. For example, when the restriction amount is small, audio output may be increased compared to that when the restriction amount is large. In addition, the color of emitted light or the number of times light is emitted from the lamp may be changed. As a result, living bodies in the surrounding area can be suitably alerted.

According to the above-described embodiments, when the power supply is restricted at a single power supplying unit 21 among the plurality of power supplying units 21, based on the presence of a living body, power supply may be restricted at the other power supplying units 21 as well. That is, the power supply control apparatus 40 may restrict power supply should the power supply be controlled at another power supplying unit 21 on the sites 101, even when the presence of a living body is not confirmed near the power supplying unit 21 or the presence of a living body is not confirmed inside the vehicle 30 that is being supplied power from the power supplying unit 21.

When the power supply is restricted regardless of the presence of a living body not being confirmed, the restriction amount may be reduced compared to that when the presence of a living body is confirmed. In addition, the power supplying unit 21 at which the power supply is being restricted can be ascertained through exchange of information over a communication network or the like.

According to the above-described embodiments, as shown in FIG. 6, interruption can be performed when the power supply is being restricted. In another example, when electric power is being consumed by an apparatus (such as an air-conditioner or a lamp) other than an apparatus (such as the ECU 50) that is used for power reception and charging, power supply amounting to the consumed electric power may be continuously performed. In addition, when electric power intermittently decreases (such as at a predetermined cycle) or decreases by a fixed amount, power supply may be resumed such that electric power amounting to the amount of decrease is supplied.

According to the above-described embodiments, the restriction amount of the supplied electric power being determined is synonymous with a supply amount of the supplied electric power being determined.

According to the above-described second embodiment, information related to whether shielding against the electromagnetic waves from the power supplying unit 20 is taken into consideration may be included in the information related to the state of another vehicle. The power supply control apparatus 40 may reduce the restriction amount when a person (living body) is determined to be present inside another vehicle and the other vehicle is the vehicle 30 in which shielding against the electromagnetic waves from the power supplying unit 20 is taken into consideration, compared to that when shielding is not taken into consideration.

The present disclosure may provide a power supply apparatus that includes a power supplying unit, a peripheral information acquiring unit, an in-vehicle information acquiring unit, and a power supply control unit. The power supplying unit supplies electric power in a contactless manner to a power receiving unit provided in a vehicle that moves using electric power stored in a storage battery provided in the vehicle. The peripheral information acquiring unit acquires peripheral information regarding whether a living body is present outside the vehicle near the power supplying unit, during power supply to the vehicle. The in-vehicle information acquiring unit acquires in-vehicle information regarding whether a living body is present inside the vehicle, during power supply to the vehicle. The power supply control unit restricts supplied electric power when the in-vehicle information acquiring unit acquires in-vehicle information indicating that a living body is present inside the vehicle or the peripheral information acquiring unit acquires peripheral information indicating that a living body is present near the power supplying unit. The power supply control unit changes a restriction amount of the supplied electric power when at least either of the in-vehicle information indicating that a living body is present inside the vehicle and the peripheral information indicating that a living body is present near the power supplying unit is acquired, compared to that when neither piece of information is acquired.

In the power supply apparatus, the supplied electric power is restricted when the in-vehicle information indicating that a living body is present inside the vehicle or the peripheral information indicating that a living body is present near the power supplying unit is acquired. Consequently, charging can be safely and efficiently performed even when the supplied electric power is increased when a living body is not present.

What is claimed is:

1. A power supply apparatus comprising:
   a power supplying unit that supplies electric power in a contactless manner to a power receiving unit provided in a vehicle that moves using electric power stored in a storage battery provided in the vehicle;
   a peripheral information acquiring unit that acquires peripheral information regarding whether a living body is present outside the vehicle near the power supplying unit, during power supply to the vehicle;
   an in-vehicle information acquiring unit that acquires in-vehicle information regarding whether a living body is present inside the vehicle, during power supply to the vehicle; and
   a power supply control unit configured to:
   restrict supplied electric power when the in-vehicle information acquiring unit acquires in-vehicle information indicating that a living body is present inside the vehicle or the peripheral information acquiring unit acquires peripheral information indicating that a living body is present near the power supplying unit,
   change a restriction amount of the supplied electric power when at least either of the in-vehicle information indicating that a living body is present inside the vehicle and the peripheral information indicating that a living body is present near the power supplying unit is acquired, compared to that when neither piece of information is acquired; and
   reduce the restriction amount of the supplied electric power when the in-vehicle information indicating that a living body is present inside the vehicle is acquired, compared to that when the peripheral information indicating that a living body is present near the power supplying unit is acquired.

2. The power supply apparatus according to claim 1, wherein:
   the power supply control unit in configured to increase the restriction amount of the supplied electric power when at least either of the in-vehicle information indicating that a living body is present inside the vehicle and the peripheral information indicating that a living body is present near the power supplying unit is acquired, compared to that when neither piece of information is acquired.

3. The power supply apparatus according to claim 1, wherein:
   the peripheral information acquiring unit is configured to acquire peripheral information regarding whether a living body is present inside another vehicle present near the power supplying unit; and
   the power supply control unit is configured to reduce the restriction amount of the supplied electric power when peripheral information indicating that a living body is present inside another vehicle present near the power supplying unit is acquired, compared to that when the peripheral information indicating that a living body is present near the power supplying unit is acquired and the peripheral information indicating that a living body is present inside the other vehicle is not acquired.

4. The power supply apparatus according to claim 3, wherein:
when the peripheral information indicating that a living body is present near the power supplying unit is acquired, the power supply control unit determines the restriction amount based on a distance from the power supplying unit to the living body.

5. The power supply apparatus according to claim 4, wherein:
the power supply control unit is configured to interrupt power supply when an amount of time over which the supplied electric power is restricted reaches a predetermined prescribed amount of time.

6. The power supply apparatus according to claim 5, wherein:
the power supply control unit is configured to determine the prescribed amount of time based on the restriction amount.

7. The power supply apparatus according to claim 6, further comprising:
a charged amount acquiring unit that acquires information related to a difference between a current charged amount and a target charged amount of the storage battery, wherein
the power supply control unit is configured to interrupt power supply when the in-vehicle information indicating that a living body is present inside the vehicle or the peripheral information indicating that a living body is present near the power supplying unit is acquired, and the difference between the current charged amount and the target charged amount is equal to or greater than a predetermined value.

8. The power supply apparatus according to claim 7, further comprising:
an instruction unit that outputs an instruction to urge exit from the vehicle when the in-vehicle information acquiring unit determines that a living body is present inside the vehicle.

9. The power supply apparatus according to claim 8, further comprising:
a notifying unit that issues a notification that power supply is being performed during power supply to the vehicle, wherein
the notifying unit changes a notification aspect based on the restriction amount.

10. The power supply apparatus according to claim 1, wherein:
when the peripheral information indicating that a living body is present near the power supplying unit is acquired, the power supply control unit determines the restriction amount based on a distance from the power supplying unit to the living body.

11. The power supply apparatus according to claim 1, wherein:
the power supply control unit is configured to interrupt power supply when an amount of time over which the supplied electric power is restricted reaches a predetermined prescribed amount of time.

12. The power supply apparatus according to claim 1, further comprising:
a charged amount acquiring unit that acquires information related to a difference between a current charged amount and a target charged amount of the storage battery, wherein
the power supply control unit is configured to interrupt power supply when the in-vehicle information indicating that a living body is present inside the vehicle or the peripheral information indicating that a living body is present near the power supplying unit is acquired, and the difference between the current charged amount and the target charged amount is equal to or greater than a predetermined value.

13. The power supply apparatus according to claim 1, further comprising:
an instruction unit that outputs an instruction to urge exit from the vehicle when the in-vehicle information acquiring unit determines that a living body is present inside the vehicle.

14. The power supply apparatus according to claim 1, further comprising:
a notifying unit that issues a notification that power supply is being performed during power supply to the vehicle, wherein
the notifying unit changes a notification aspect based on the restriction amount.

15. The power supply apparatus according to claim 1, wherein:
the in-vehicle information acquiring unit includes at least one of:
a pressure sensor that is provided in the vehicle and detects a weight of the living body;
an ignition that is provided in the vehicle; and
an in-vehicle camera that is provided in the vehicle and captures an image of a state inside the vehicle.

16. The power supply apparatus according to claim 1, wherein:
the power supply control unit changes the restriction amount of the supplied electric power based on whether the vehicle that is being subjected to power supply is configured to shield against electromagnetic waves.

17. A power supply method comprising:
supplying electric power in a contactless manner to a power receiving unit provided in a vehicle that moves using electric power stored in a storage battery provided in the vehicle;
acquiring peripheral information regarding whether a living body is present outside the vehicle near the power supplying unit, during power supply to the vehicle;
acquiring in-vehicle information regarding whether a living body is present inside the vehicle, during power supply to the vehicle;
restricting supplied electric power when in-vehicle information indicating that a living body is present inside the vehicle is acquired or when peripheral information indicating that a living body is present near the power supplying unit is acquired; and
changing a restriction amount of the supplied electric power when at least either of the in-vehicle information indicating that a living body is present inside the vehicle and the peripheral information indicating that a living body is present near the power supplying unit is acquired, compared to that when neither piece of information is acquired; and
reducing the restriction amount of the supplied electric power when the in-vehicle information indicating that a living body is present inside the vehicle is acquired, compared to that when the peripheral information indicating that a living body is present near the power supplying unit is acquired.

\* \* \* \* \*